FIELD-EFFECT TRANSISTORS

Original Filed Aug. 14, 1962

W. F Parmer
INVENTOR
BY John D. Graham
ATTORNEY

United States Patent Office 3,346,786

Patented Oct. 10, 1967

3,346,786
FIELD-EFFECT TRANSISTORS

Will F. Parmer, Dallas, Tex., assignor to Texas Instruments Incorporated, Dallas, Tex., a corporation of Delaware Continuation of application Ser. No. 216,843, Aug. 14, 1962. This application July 26, 1966, Ser. No. 568,056
9 Claims. (Cl. 317—235)

ABSTRACT OF THE DISCLOSURE

The invention relates to a field effect transistor having a gate electrode on opposite sides of the channel. The two gates are in a single region of one conductivity-type material, opposite to that of the channel, and the region extends from one gate to the other interconnecting them.

This application is a continuation of application No. 216,843, filed Aug. 14, 1962, now abandoned.

Field-effect transistors are preferably fabricated in the double-gate geometry since this configuration offers the advantages of higher transconductance and lower pinch-off voltage. This results from the fact that two gates provide two depletion regions moving toward one another rather than a single depletion region moving toward the surface of the semiconductor. It is usually desirable to connect the two gates electrically, but heretofore this connection is made by providing electrical contacts on both gates and connecting a lead between the contacts. This adds several steps to the fabrication procedure, resulting in more chances for mistakes and reducing yield. Also, the completed devices have inherently lower reliability due to the additional structural elements. The necessity of making electrical connection to the second gate requires that the dimensions of the gate be adequate to facilitate depositing contact material and bonding a lead to the contact. This needlessly expands the gate area, resulting in an increase in the capacitance between the gate and the other regions, limiting the frequency response of the device. Also, the length of the channel from source to drain is preferably quite short, but this requirement is inconsistent with the necessity for placing an electrical contact on the gate.

Accordingly, it is the principal object of this invention to provide a double-gate field-effect transistor adapted for fabrication by diffusion techniques which does not require external connections between the two gates. An additional object is to provide an improved field-effect transistor. Another object is to provide a diffused field-effect transistor having internally-connected gates. A further object is to provide a simplified technique for fabricating semiconductor devices such as field-effect transistors.

In accordance with this invention, a field-effect transistor is fabricated by a double-diffusion technique wherein the channel is first diffused into a wafer of semiconductor material and then the top gate is diffused into the channel region. The diffusion patterns are such that the top gate region produced by the second diffusion will be ohmically connected within the semiconductor crystal to the un-diffused bulk of the wafer, the latter portion forming the second gate. Thus, the two gate regions are internally connected together without requiring an additional bonded contact and lead.

The novel features, objects and advantages of the present invention will become readily apparent from the following description when taken in conjunction with the appended claims and detailed drawings wherein:

Figure 1:
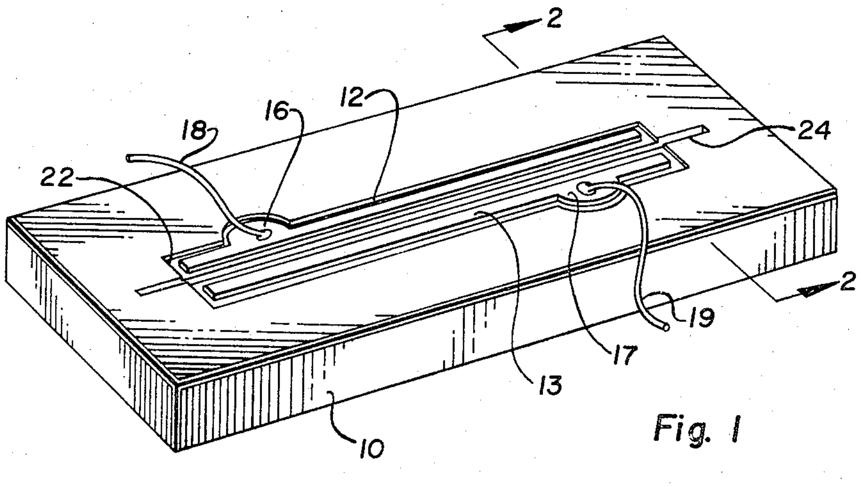
FIGURE 1 is a greatly enlarged pictorial view of a field-effect transistor constructed according to this invention.
Figures 2, 3:
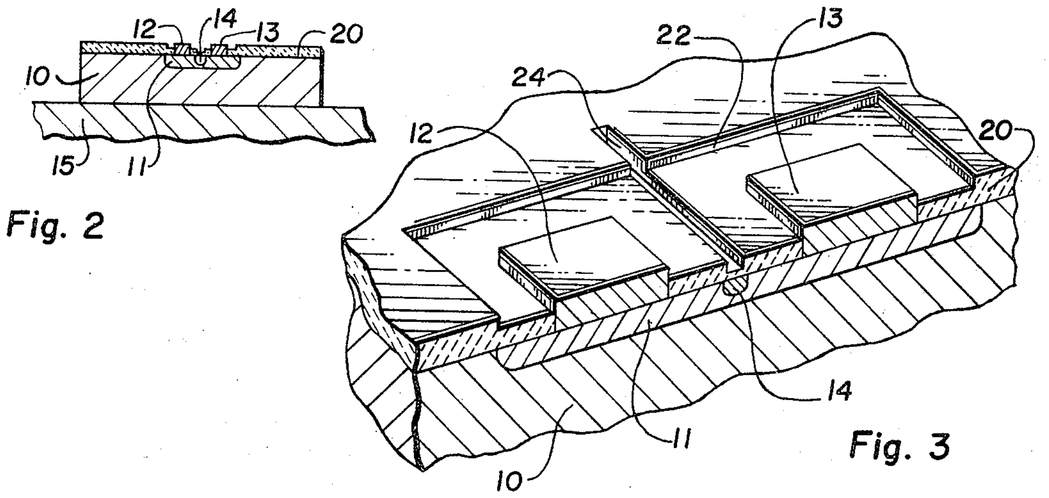
FIGURE 2 is a sectional view of the device of FIGURE 1 taken along the lines 2—2.
FIGURE 3 is a greatly enlarged, fragmentary, pictorial view in section of the active area of the device of FIGURE 1, also viewed along the lines 2—2.

With reference to FIGURES 1 and 2, a field-effect transistor of the double-diffused planar type having a P-type channel and internally-connected gates is illustrated. This device is constructed on an N-type silicon wafer 10, which forms the lower gate, and includes a diffused P-type region 11 forming channel, source and drain regions. A source contact 12 and a drain contact 13 are positioned on opposite sides of the region 11. A diffused N-type region 14, forming the top gate, is provided to separate the source and drain, and to define the limits of the P-type channel. According to this invention, this second diffused region 14 extends beyond the ends of the P-type diffused region 11 and so makes ohmic contact to the N-type parent wafer 10. Thus, the top gate region 14 and the bottom gate defined by the wafer 10 are connected together, and so a single gate connection is all that is necessary. This gate connection is made by bonding or soldering the back of the wafer 10 to a conductive plate 15 which may be a conventional transistor header. The source and drain contacts 12 and 13 may have enlarged areas 16 and 17 to which leads 18 and 19 may be easily bonded. These leads would be connected to studs in the transistor header in accordance with conventional packaging techniques. The device is preferably fabricated by oxide masking techniques and so an oxide layer 20 remains on the top surface of the silicon wafer to protect the P-N junctions.

A method for fabricating the devices illustrated in FIGURES 1 and 2 may best be described with reference to FIGURE 3, which is a greatly enlarged sectional view of a small portion of the wafer 10 in the active area. The original wafer, from which many of the devices may be made simultaneously, may be doped with phosphorus upon growing to a level which produces a resistivity of greater than about one ohm-cm. The top surface of the wafer 10 is first polished and cleaned, then a silicon oxide layer is applied by passing steam over the heated wafer, for example. A generally rectangular opening 22 defining the outline of the region 11 is then formed in the oxide by photo-resist masking techniques, exposing the bare silicon within this area. This opening 22 could be perhaps 60 mils long by 6 mils wide, for example. The region 11 is thereafter formed by depositing boron on the surface of the wafer and then heating to a temperature of about 1200° C. or over for a time sufficient to provide a junction depth of about 0.15 mil. At the same time, an oxide coating 23 is formed over the area exposed by the opening 22. A second photo-resist masking step is then performed to define an elongated narrow opening 24 above what will be the region 14, exposing a narrow area of the surface of the wafer perhaps 0.5 mil wide and 65 mils long. The major portion of the length of this opening 24 lies over the region 11, but it is seen that the ends extend over the un-diffused area of the wafer. The region 14 is then formed by depositing phosphorus on the wafer surface and heating at a temperature of perhaps 1200° C. or more for several hours or until a junction depth of about 0.10 mil results. The junction depths are of interest primarily due to the fact that a channel thickness of about 0.05 mil provides particularly advantageous characteristics. During the N-type diffusion, more oxide is formed on the wafer surface, and covers the region 14 or opening 24. This oxide coating is of course left on the device to protect the surface. The source and drain contacts 12 and 13 are then made by selectively etching holes in the oxide coating and then evaporating aluminum onto the surface and removing the unwanted aluminum by masking and etching.

Figure 4:
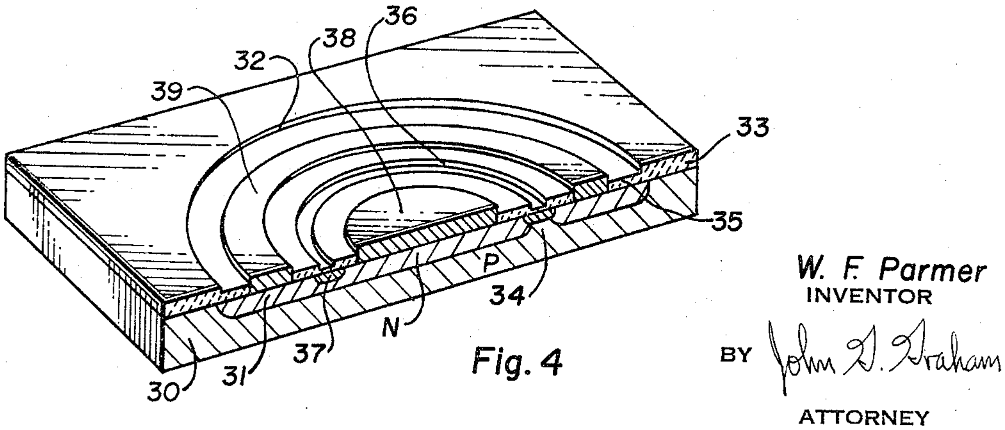
FIGURE 4 is a pictorial view in section of another embodiment of a field-effect transistor constructed according to this invention.

With reference to FIGURE 4, there is shown a field-effect transistor of circular geometry which employs the internally-connected gates of this invention. Assuming that an N-type channel is desired, a P-type silicon wafer 30 is utilized, and an N-type diffused region 31 is formed in the top surface by oxide masking techniques comprising opening a circular hole 32 in an oxide coating 33 and diffusing from a deposited phosphorus source. A very small portion of the oxide coating 33 is left intact within the area exposed by the opening 32, providing a diffusion mask for a small area under that will subsequently be the top gate. This small masked area will remain undiffused and a portion 34 of the parent material will extend to the surface. After the first diffusion step, which also forms another oxide coating 35 over the previously-exposed surface, a ring-shaped opening 36 is cut in the oxide by photo-resist masking and etching. Boron is deposited on the top surface of the wafer and diffused through the ring-shaped opening 36 to form a ring-shaped diffused region 37 which is the top gate. This region 37 is spaced from the P-N junction outlining the region 31 by perhaps 0.05 mil, except for the portion overlying the un-diffused region 34. Here the P-type material of the wafer 30 and the P-type diffused region 37 overlap, providing the desired internal connection of the gates. Simultaneously with the P-type diffusion, an oxide coating is formed over the opening 36, and this coating remains on the device for surface passivation. A circular contact 38 and a ring-shaped contact 39, providing the source and drain connections are then applied by removing correspondingly-shaped areas of the oxide coating 35 and depositing aluminum in the exposed surface areas. The single gate connection is made by bonding the wafer 30 to a conductive plate (not shown) such as a transistor header as suggested above.

While the device of FIGURE 4 is of circular geometry, the principles could be equally well applied to any closed or concentric configuration. Thus, a rectangular pattern wherein the top gate encloses the source or drain could be fabricated in the same manner as described above, the only difference being in the shapes of the masks used. Of course, either of the preferred embodiments set forth above could have either P-type or N-type gates.

It is seen that the basic feature of this invention is the concept of masking the channel diffusion in such a fashion that a portion of the parent material remains un-diffused. The gate diffusion is then made so that impurities are diffused into both the channel region and into a portion of the parent material remaining on the surface of the wafer. Of course, in speaking of the parent material in this sense, it is contemplated that this may as well be itself a diffused region, in which case a triple-diffused device would be provided. Also, even though the examples given above describe only diffusion for making the top gate region, the concepts of this invention, in its broadest aspects, may well be applied to a double-gate field-effect transistor wherein the top gate is provided by an alloyed region.

Accordingly, although the invention has been described with reference to illustrate embodiments, this description is not meant to be construed in a limiting sense. It is of course understood that various modifications may be made by persons skilled in the art, and so it is contemplated that appended claims will cover any such modifications as fall within the true scope of the invention.

What is claimed is:

1. A field-effect transistor comprising a semiconductor body of one type of conductivity, a first region within said semiconductor body and adjacent a major face thereof comprised of semiconductor material of the opposite conductivity type from said semiconductor body, said first region being separated from the rest of said semiconductor body by a P-N junction, a second region having the same conductivity type as said semiconductor body extending across said first region and separating surface portions of the said first region adjacent said major face into two distinct parts and connecting with said semiconductor body, said first region comprising a channel, between said body and second region, connecting said parts, and contacts connected to said two parts of said first region and said semiconductor body.

2. A field-effect transistor comprising a semiconductor substrate having at least one substantially flat major face, a first region comprising substantially the entire portion of said substrate containing a one-type conductivity, a second region formed in said major face of said substrate within said first region of an opposite type conductivity than said first region, said second region separated from said first region by a P-N junction which terminates at said major face, a third region having the same conductivity type as said first region extending through said second region and electrically connecting with said first region within said substrate, said third region being separated from said second region by a P-N junction which terminates at said major face, said first region and said third region forming the gates of said field-effect transistor and said second region forming the source, channel and drain of said field-effect transistor.

3. A field-effect transistor comprising:

(a) a wafer of monocrystalline semiconductor material, the major bulk of the wafer being composed of semiconductor material of one conductivity-type and providing a first gate, (b) a first region of the wafer adjacent a major face composed of semiconductor material of the opposite conductivity-type and providing a source, a drain and a channel, the first region being separated from the bulk of the wafer by a P-N junction which extends to the major face and defines an enclosed surface area, (c) a second region of the wafer adjacent said surface composed of semiconductor material of said one conductivity-type and providing a second gate, the second region being contiguous to the first region but separated therefrom by a P-N junction, (d) and at least one portion of the wafer contiguous to both the second region and the major bulk formed by coextensive parts thereof composed of semiconductor material of said one conductivity-type and effective to provide internal ohmic connection between the first and second gates, the second region being spaced from the first region by said channel of the first region except for said portion.

4. A field-effect transistor according to claim 3 wherein said portion is outside the enclosed surface area.

5. A field-effect transistor according to claim 3 wherein said portion is within the enclosed surface area.

6. A field-effect transistor comprising:

(a) a wafer of monocrystalline semiconductor material, (b) a first region of the wafer adjacent a surface thereof composed of semiconductor material of one conductivity-type, said first region providing a first gate, (c) a thin second region of the wafer adjacent said surface composed of semiconductor material of the opposite conductivity-type and providing a source, a drain and a channel, the second region being contiguous to the first region but separated therefrom by a P-N junction which extends to said surface and defines an enclosed surface area, (d) a narrow elongated third region of the wafer adjacent said surface composed of semiconductor material of said one conductivity-type and providing a second gate, the third region being contiguous to the second region but separated therefrom by a P-N junction, (e) and at least one connecting portion of the wafer contiguous to both the first and third regions formed by coextensive parts thereof, the connecting portion being composed of semiconductor material of said one conductivity-type and effective to provide internal ohmic connection between the first and second gates, the third region being spaced from the first region by said channel of the second region except for said connecting portion.

7. A field-effect transistor according to claim 6 wherein two of the connecting portions are provided external of the enclosed surface area.

8. A field-effect transistor according to claim 6 wherein one connecting portion is provided within the enclosed surface area.

9. A field-effect transistor comprising:

(a) a wafer of monocrystalline semiconductor material, (b) a first region of the wafer adjacent a surface thereof composed of semiconductor material of one conductivity-type, said first region providing a first gate, (c) a thin, diffused, second region of the wafer adjacent said surface composed of semiconductor material of the opposite conductivity-type and providing a source region and a drain region connected within the wafer only by a thin channel region, the second region being contiguous to the first region but separated therefrom by a P-N junction, (d) a narrow, elongated, third region of the wafer adjacent said surface composed of semiconductor material of said one conductivity-type and providing a second gate, the third region overlying the channel region and being contiguous thereto but separated therefrom by a P-N junction, (e) and at least one connecting portion of the wafer contiguous to both the first and third regions formed by coextensive parts thereof, the at least one connecting portion being composed of semiconductor material of said one conductivity-type and effective to provide internal ohmic connection between the first and second gates.

References Cited

UNITED STATES PATENTS

| | | | |
|---|---|---|---|
| 2,648,805 | 8/1953 | Spenke et al. | 317—235.21 |
| 2,805,397 | 9/1957 | Ross | 317—235.21 |
| 2,869,054 | 1/1959 | Tucker | 317—235.21 |
| 3,025,438 | 3/1962 | Wegener | 317—235.21 |
| 3,152,294 | 10/1964 | Siebertz et al. | 317—235.21 |
| 3,183,128 | 5/1965 | Leistiko et al. | 317—235.21 |

JAMES D. KALLAM, *Primary Examiner.*